United States Patent [19]
Ryou

[11] Patent Number: 5,468,670
[45] Date of Patent: Nov. 21, 1995

[54] METHOD FOR FABRICATING A SEMICONDUCTOR MEMORY DEVICE HAVING A STACKED CAPACITOR CELL

[75] Inventor: Eui K. Ryou, Kyoungki-do, Rep. of Korea

[73] Assignee: Hyundai Electronics Industries Co., Ltd., Kyoungki-do, Rep. of Korea

[21] Appl. No.: 273,904

[22] Filed: Jul. 12, 1994

[30] Foreign Application Priority Data

Jul. 14, 1993 [KR] Rep. of Korea ............... 1993-13268
Aug. 17, 1993 [KR] Rep. of Korea ............... 1993-15934

[51] Int. Cl.⁶ .......................... H01L 21/70; H01L 27/00
[52] U.S. Cl. .................... 437/52; 437/60; 437/919
[58] Field of Search .................... 437/47, 52, 60, 437/915; 439/919

[56] References Cited

U.S. PATENT DOCUMENTS 5,137,842 8/1992 Chan et al. .................... 437/48
5,389,560 2/1995 Park .................... 437/52

Primary Examiner—Olik Chaudhuri
Assistant Examiner—H. Jey Tsai
Attorney, Agent, or Firm—Gary M. Nath; Nath & Associates

[57] ABSTRACT

A semiconductor memory device capable of obtaining a sufficient charge storage capacity and yet having a reduced occupied memory cell area. The semiconductor memory device includes a field effect transistor formed on a semiconductor substrate, an interlayer insulating film formed over the field effect transistor, a first charge storage electrode pattern having a plane plate shape and formed over the interlayer insulating film such that it is electrically connected with the field effect transistor, a second charge storage electrode pattern having a double cylindrical structure and formed over the first charge storage electrode pattern such that it is electrically connected with the first charge storage electrode pattern, and a dielectric film and a plate electrode sequentially formed over the entire exposed surfaces of the first and second charge storage electrode patterns.

6 Claims, 7 Drawing Sheets

METHOD FOR FABRICATING A SEMICONDUCTOR MEMORY DEVICE HAVING A STACKED CAPACITOR CELL

BACKGROUND OF THE INVENTION

1. Field of the Invention

The present invention relates to a highly integrated semiconductor memory device and a method for fabricating the same, and more particularly to a semiconductor memory device capable of reducing a memory cell area and yet having a sufficient charge storage capacity.

2. Description of the Prior Art

As semiconductor memory devices such as general direct random access memory have a higher integration degree, they involve a problem of having an insufficient charge storage capacity. This is because the higher integration degree results in a great decrease in occupied area of memory cells and thereby a decrease in surface area of storage electrodes. In a conventional case shown in FIG. 1, actually, a storage electrode 11 constituting a memory cell together with a field effect transistor has a surface area sharply reduced in proportion to a decrease in occupied area of the memory cell because it is formed over the field effect transistor to have a plane plate shape. Furthermore, the plane plate shape of the storage electrode results in a difficulty to increase the surface area of storage electrode.

As shown in FIG. 1, the conventional semiconductor memory device includes a field oxide film 2 formed on the semiconductor substrate 1, a gate insulating film 3 and a word line 4 both formed at an element region of the semiconductor substrate 1, oxide film spacers 5 respectively formed on side walls of the word line 4, and source and drain regions 6 and 6' formed at a portion of semiconductor substrate 1 exposed by an impurity ion injection process. Over the entire exposed surface of the resulting structure, a planarizing insulating film 7 is coated. On the planarizing insulating film 7, the storage electrode 11 is disposed such that it is in contact with the source region 6 (or the drain region 6'). Over the entire exposed surface of the resulting structure, a dielectric film 18 and a plate electrode 19 are sequentially formed.

Since the conventional semiconductor memory device has the plane plate type storage electrode, it has an insufficient charge storage capacity when the occupied area of the memory cell thereof is reduced. As a result, the conventional semiconductor memory device is difficult to have a higher integration degree due to the insufficient charge storage capacity.

SUMMARY OF THE INVENTION

Therefore, an object of the invention is to provide a semiconductor memory device capable of obtaining a sufficient charge storage capacity and yet having a reduced occupied memory cell area.

In accordance with one aspect, the present invention provides a semiconductor memory device comprising: a field effect transistor formed on a semiconductor substrate; an interlayer insulating film formed over the field effect transistor; a first charge storage electrode pattern having a plane plate shape and formed over the interlayer insulating film such that it is electrically connected with the field effect transistor; a second charge storage electrode pattern having a double cylindrical structure and formed over the first charge storage electrode pattern such that it is electrically connected with the first charge storage electrode pattern; and a dielectric film and a plate electrode sequentially formed over the entire exposed surfaces of the first and second charge storage electrode patterns.

In accordance with another aspect, the present invention provides a method for fabricating a dynamic random access memory cell, comprising the steps of: forming a planarizing insulating film over a semiconductor substrate including a metal oxide transistor, sequentially depositing an etch barrier layer and a polysilicon layer over the planarizing insulating film, and etching a portion of the polysilicon layer corresponding to a contact region by use of a storage electrode contact mask, thereby forming polysilicon spacers respectively on side walls of the polysilicon layer; etching a portion of the etch barrier layer corresponding to the contact region and a portion of the planarizing insulating film disposed beneath the portion of the etch barrier layer by using the polysilicon layer and the polysilicon spacers as a mask, thereby forming a contact hole through which the semiconductor is partially exposed; sequentially forming a polysilicon layer for a first storage electrode and a first oxide film over the entire exposed surface of the resulting structure, forming a photoresist pattern at a storage electrode contact region, and a second oxide film over an exposed portion of the first oxide film; removing the photoresist pattern, forming a photoresist pattern for a storage electrode mask, and removing respective exposed portions of the second oxide film, the first oxide film, the polysilicon layer for the first storage electrode and the polysilicon layer, thereby primarily forming a storage electrode pattern; removing the photoresist pattern for the storage electrode, forming a polysilicon layer for a second storage electrode, and forming spacers of a third oxide film respectively on side walls of the polysilicon layer for the second storage electrode; etching the polysilicon layer for the second storage electrode until both the second oxide film and the etch barrier layer are exposed, thereby forming a storage electrode pattern having a double cylindrical structure; and removing respective remaining portions of the third oxide film spacers, the second oxide film and the first oxide film, forming a dielectric film for a capacitor over the storage electrode pattern, and forming a plate electrode over the dielectric film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
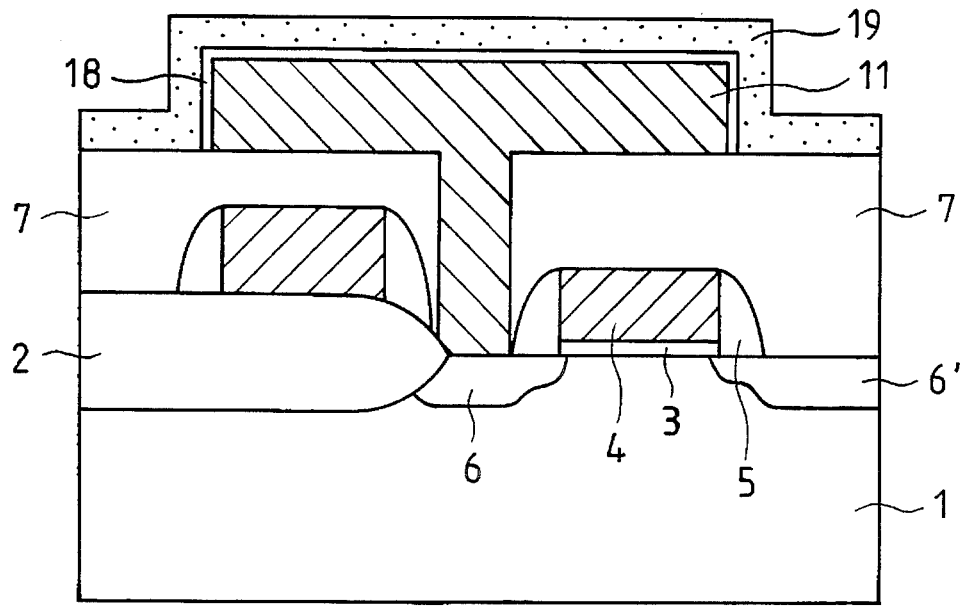
FIG. 1 is a sectional view illustrating a conventional semiconductor memory device.
Figure 2:
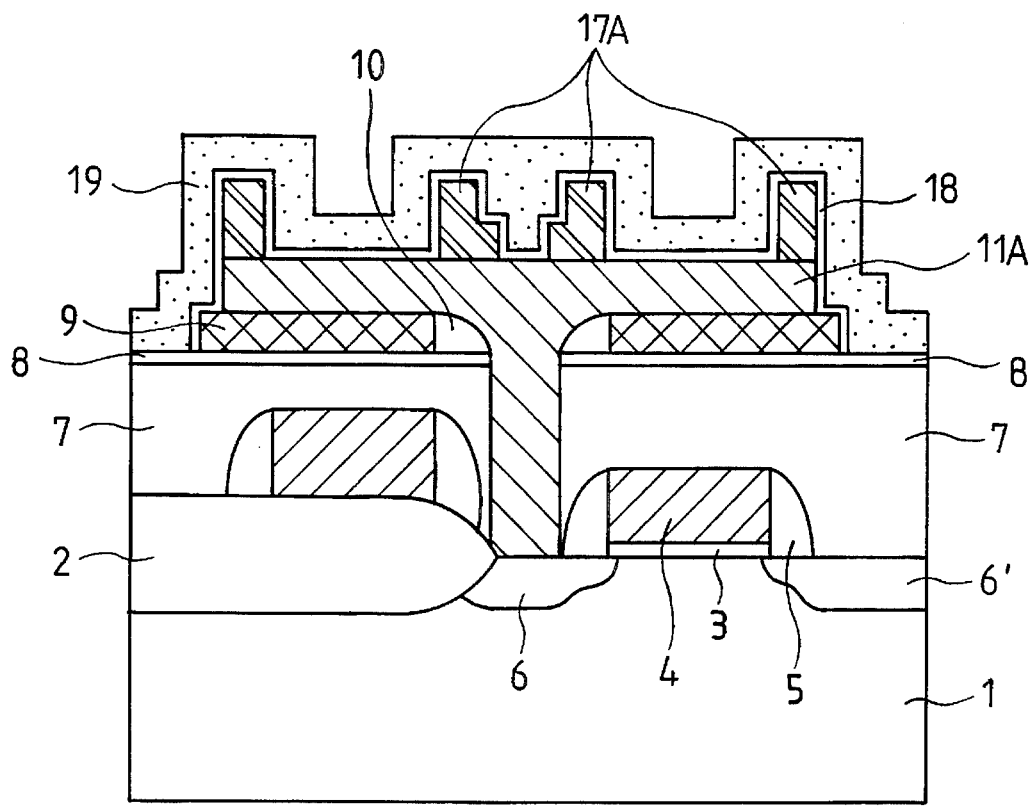
FIG. 2 is a sectional view illustrating a semiconductor memory device in accordance with an embodiment of the present invention.

FIG. 2 is a sectional view illustrating a semiconductor memory device in accordance with an embodiment of the present invention. In FIG. 2, elements respectively corresponding to those in FIG. 1 are denoted by the same reference numerals.

As shown in FIG. 2, the semiconductor memory device includes a semiconductor substrate 1 formed with a field effect transistor at its element region defined by a field oxide film 2 which is disposed on the semiconductor substrate 1. Over the field effect transistor, an insulating film 7 and a nitride film 8 made of an etch barrier material are sequentially formed.

The field effect transistor has a lightly doped drain structure including a diffusion region 6 for drain or source, another diffusion region 6' for source or drain, a gate oxide film 3 disposed at a channel region defined between the diffusion regions 6 and 6', and a word line 4 disposed over the gate oxide film 3 and serving as a gate electrode. A spacer oxide film 5 is formed on each of side walls of the word line 4. Each of the diffusion regions 6 and 6' has a low concentration impurity region (not shown) and a high concentration impurity region (not shown).

The semiconductor memory device further includes a first charge storage electrode pattern 11A formed on the nitride film 8 and electrically connected with the diffusion region 6, and a second charge storage electrode pattern 17A formed on the first charge storage electrode pattern 11A and having a double cylindrical structure. The first and second charge storage electrode patterns 11A and 17A are electrically connected with each other. Over exposed upper surfaces of the first and second charge storage electrode patterns 11A and 17A, a dielectric film 18 and a plate electrode 19 are sequentially formed.

FIGS. 3A to 3E are sectional views respectively illustrating a method for fabricating the memory cell of the semiconductor memory device having the above-mentioned structure in accordance with the embodiment of the present invention. In FIGS. 3A to 3E, elements respectively corresponding to those in FIG. 2 are denoted by the same reference numerals.

Figure 3A:
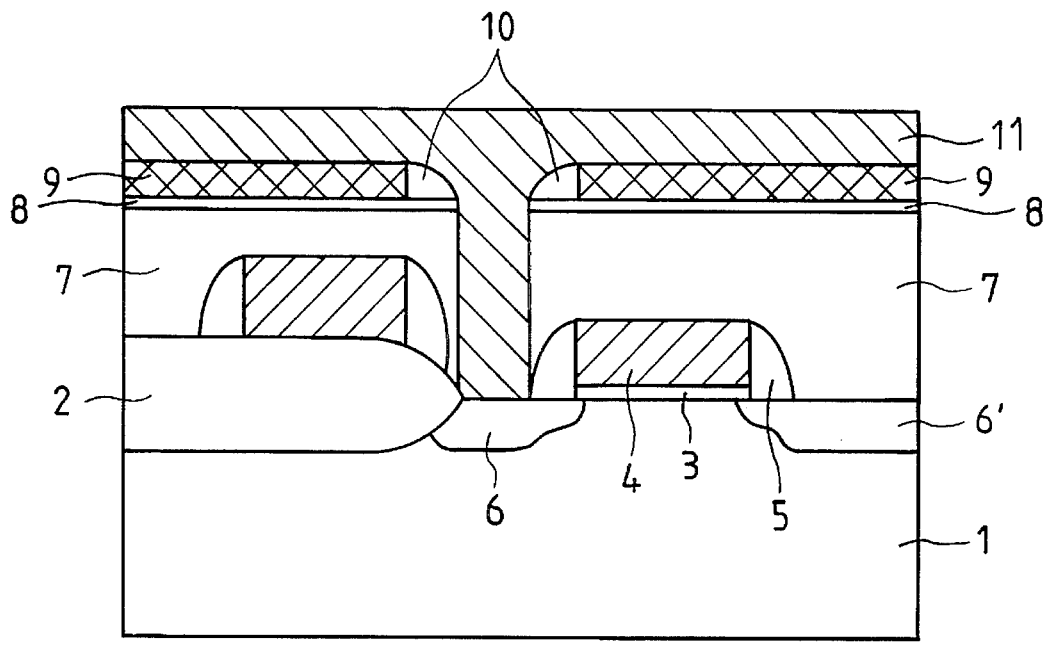
FIGS. 3A to 3E are sectional views respectively illustrating a method for fabricating the memory cell of the semiconductor memory device shown in FIG. 2.

In accordance with this method, a semiconductor substrate 1 formed with a P-well or N-well is prepared, as shown in FIG. 3A. On the upper surface of the semiconductor substrate 1, a field oxide film 2 is grown using the LOCOS process. By the field oxide film 2, element regions are defined on the upper surface of the semiconductor substrate 1. At each element region of the semiconductor substrate 1, a gate oxide film 3 and a word line pattern 4 are sequentially deposited. Thereafter, N type (or P type) impurity ions are implanted in a low concentration into a portion of each element region exposed between adjacent word line patterns 4, thereby forming a low concentration diffusion region at the upper surface of semiconductor substrate 1. After completion of the low concentration impurity ion implantation, a spacer oxide film 5 is formed on each side wall of each word line pattern 4. Subsequently, N type (or P type) impurity ions are implanted in a high concentration into a portion of semiconductor substrate 1 exposed between adjacent spacer oxide films 5, thereby forming a high concentration diffusion region beneath each low concentration diffusion region. These low and high concentration diffusion regions constitute diffusion regions 6 and 6' of each LDD structure, respectively. Together with these diffusion regions 6 and 6', each corresponding word line pattern 4 constitutes a field effect transistor. The fabrication of such a field effect transistor is achieved in the same manner as in the conventional memory cell fabrication method.

An insulating oxide film 7 is then deposited over the portion of semiconductor substrate 1 on which the field effect transistor is formed, so as to obtain an interlayer insulation. The insulating oxide film 7 has a planarized surface formed by a full-surface etch process. Over the planarized surface of insulating oxide film 7, a nitride film 8 and a polysilicon film 9 are sequentially formed to have predetermined thicknesses, respectively. The nitride film 8 serves as an etch barrier whereas the polysilicon film 9 is used as a mask at a subsequent step. A polysilicon spacer 10 is then partially formed on each of side walls of the polysilicon film 9. Each of the polysilicon spacer 10 is formed by anisotropically etching a predetermined portion of the polysilicon film 9.

Over the entire exposed surface of the resulting structure including the polysilicon film 9 and the polysilicon spacer 10, a first charge storage electrode layer 11 is formed such that it is electrically connected with the diffusion region 6 for source (or drain). The formation of the first charge storage electrode layer 11 is achieved by removing a portion of the nitride film 8 exposed between adjacent polysilicon spacers 10 and a portion of the insulating oxide film 7 disposed beneath the exposed portion of nitride film 8 to form a contact hole through which the diffusion region 6 for source (or drain) is exposed, depositing a polysilicon film over the entire exposed surface of the resulting structure including the contact hole to a predetermined thickness, and implanting impurity ions into the polysilicon film.

In this case, it is noted that since the contact hole is formed by use of the polysilicon spacers 10, neighboring word lines 4 can have a space corresponding to the dimension of the minimum pattern. The nitride film 8 has a higher etch selectivity than those of the polysilicon layer 9 and the polysilicon spacer 10 to serve as the etch barrier.

Figure 3B:
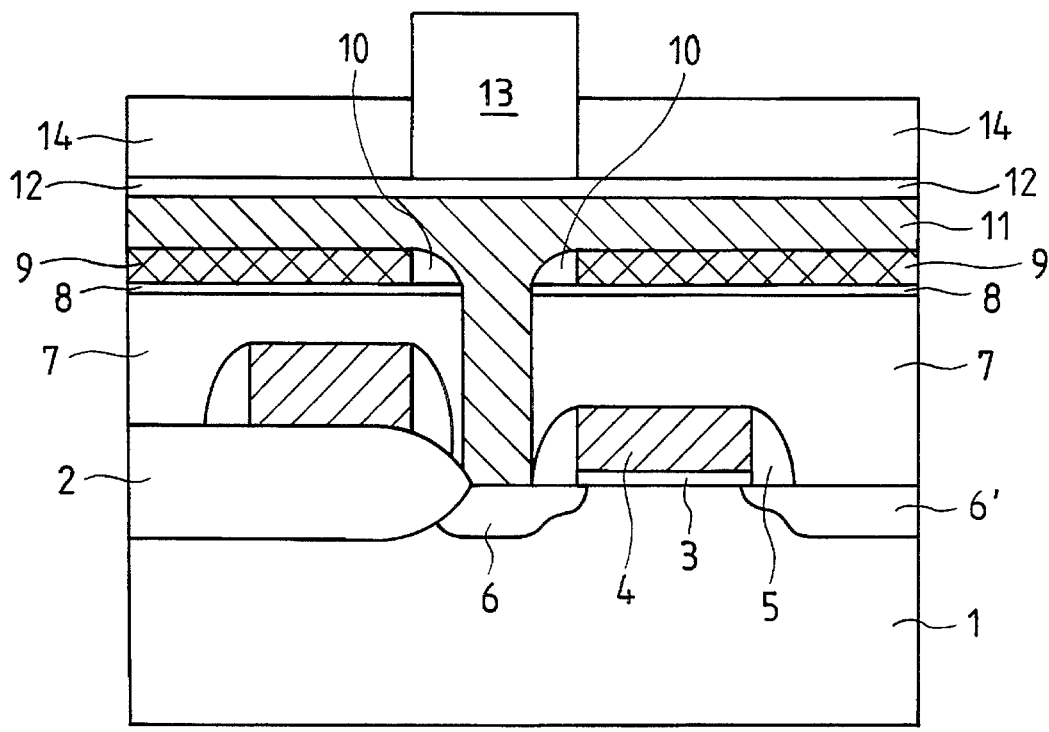

A first oxide film 12 is then deposited over the first charge storage electrode layer 11, as shown in FIG. 3B. Thereafter, a photoresist pattern 13 is formed only at a storage electrode contact region of the first oxide film 12. A second oxide film 14 is grown over a portion of the first oxide film exposed after the formation of photoresist pattern 13. The second oxide film 14 is selectively formed on the first oxide film 12 using a liquid phase deposition (LPD) process.

Figure 3C:
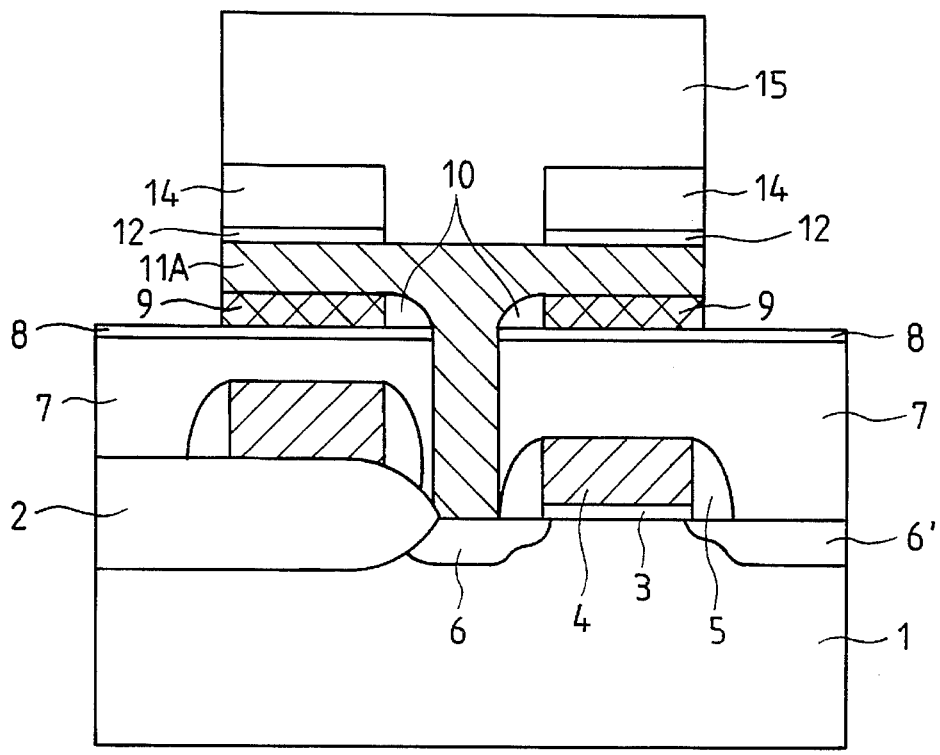

After completion of the step shown in FIG. 3B, the photoresist pattern 13 is removed, thereby exposing a portion of the first oxide film 12 disposed beneath the photoresist pattern 13, as shown in FIG. 3C. The exposed portion of the first oxide film 12 is then etched, thereby partially exposing the first charge storage electrode layer 11. During the etch of the first oxide film 12, the second oxide film 14 is also etched to a predetermined depth. Subsequently, a photoresist pattern 15 for storage electrode mask is formed over a predetermined width of the entire exposed surface of the resulting structure. Portions of the second oxide film 14, the first oxide film 12, the first charge storage electrode layer 11 and the polysilicon layer 9 exposed after the formation of the photoresist pattern 15 are then etched, thereby forming a first charge storage electrode pattern 11A.

Figure 3D:
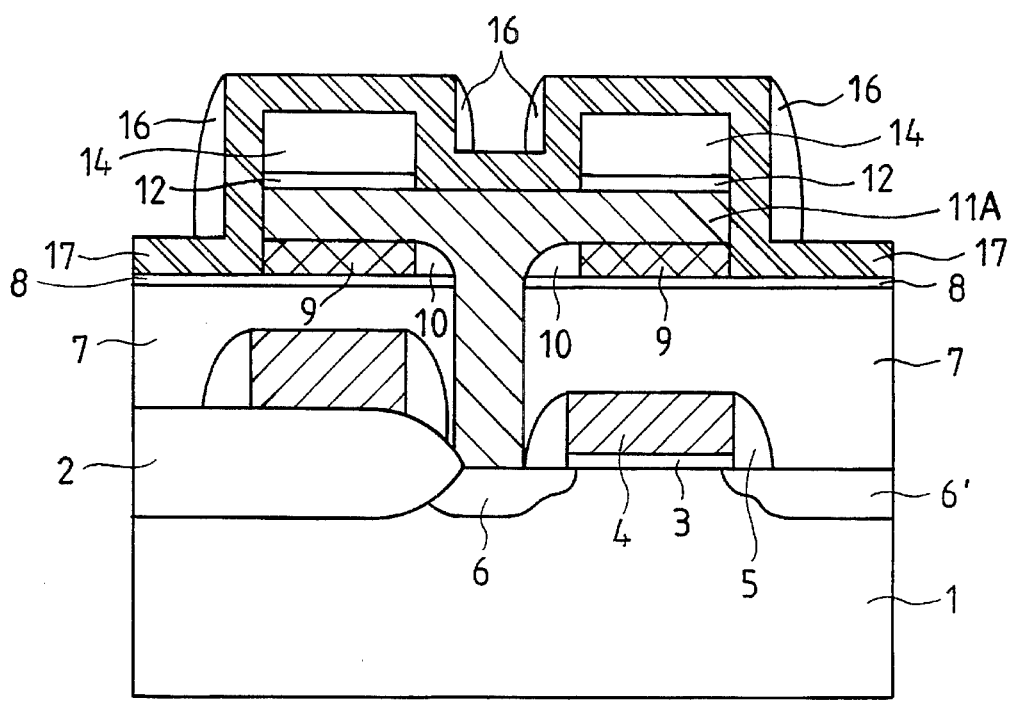

Thereafter, the photoresist pattern 15 for storage electrode mask is removed. Over the entire exposed surface of the resulting structure, a second charge storage electrode layer 17 is formed using a deposition process, as shown in FIG. 3D. The second charge storage electrode layer 17 is comprised of a doped polysilicon layer. Subsequently, an oxide film spacer 16 is formed on each of side walls of the second charge storage electrode layer 17. The formation of oxide film spacers 16 is achieved by depositing a third oxide film over the second charge storage electrode layer 17 and then full-surface etching the third oxide film.

Figure 3E:
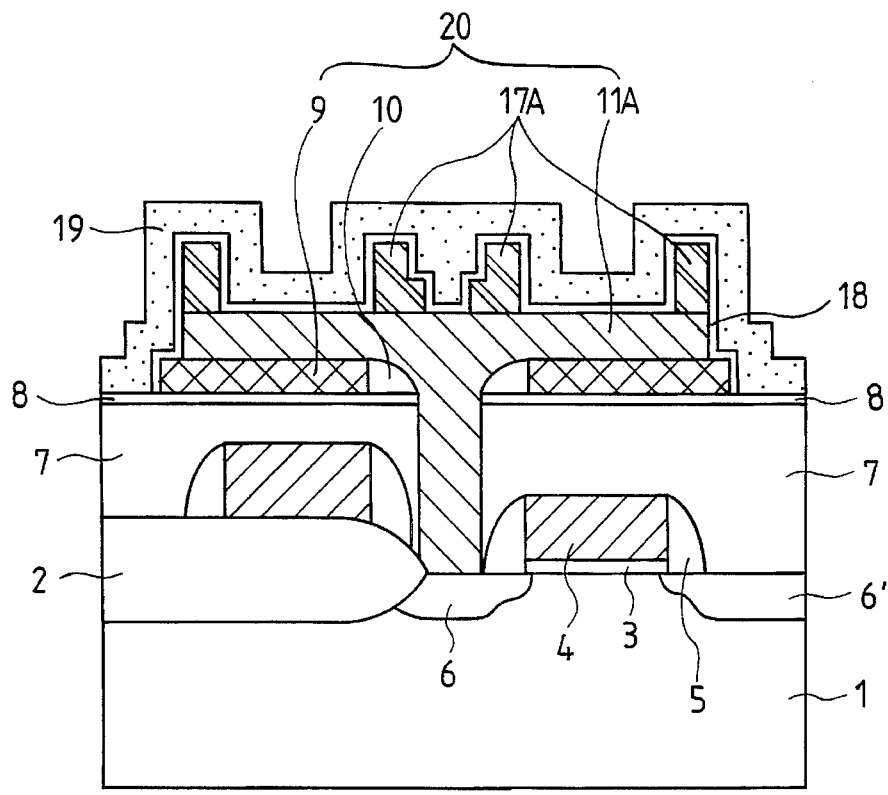

Portions of the second charge storage electrode layer 17 exposed after the formation of oxide film spacers 16 shown in FIG. 3D are then etched until both the second oxide film 14 and the nitride film 8 are exposed. By this etch step, a second charge storage electrode pattern 17a having a double cylindrical structure is obtained, as shown in FIG. 3E. The second charge storage electrode pattern 17a constitutes a storage electrode 20, together with the polysilicon layer 9, the polysilicon spacer 10 and the first charge storage electrode pattern 11A. After completion of the etch of the second charge storage electrode layer 17, the third oxide film spacer 16, the second oxide film 14 and the first oxide film 12 are completely removed using an etch process, thereby exposing the entire surface of the storage electrode 20. Over the exposed entire surface of the storage electrode 20, a dielectric film 18 and a plate electrode 19 are sequentially formed. In some cases, the formation of oxide film spacers 16 carried out at the step shown in FIG. 3D may be omitted. In this case, edge portions of the lower end of the storage electrode 20 are removed.

Figure 4:
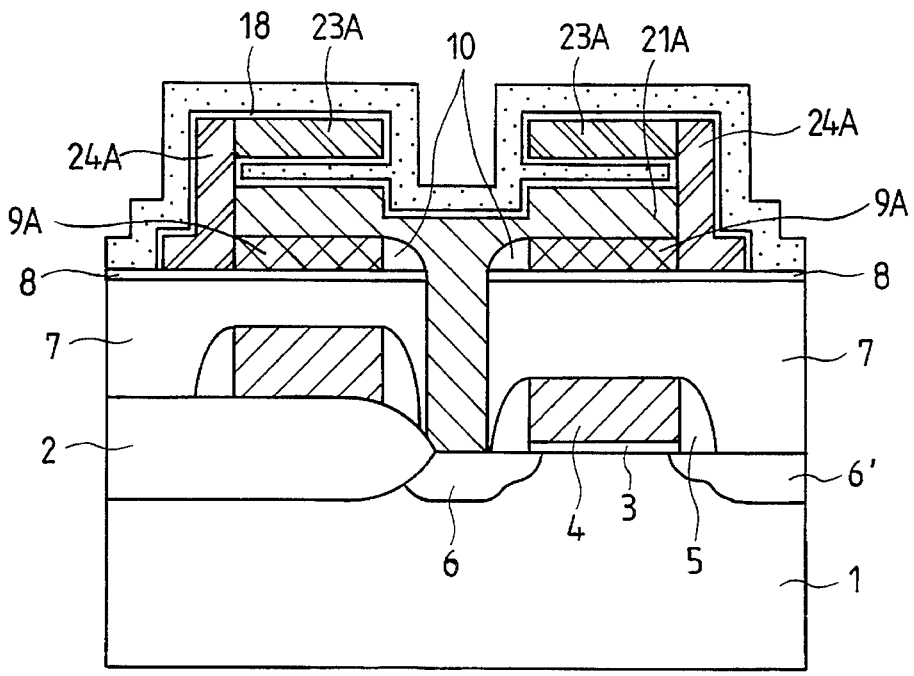
FIG. 4 is a sectional view illustrating a semiconductor memory device in accordance with another embodiment of the present invention.

Referring to FIG. 4, there is illustrated a semiconductor memory device in accordance with another embodiment of the present invention. In FIG. 4, elements respectively corresponding to those in FIGS. 2 to 3E are denoted by the same reference numerals.

As shown in FIG. 4, the semiconductor memory device includes a semiconductor substrate 1 formed with a field effect transistor at its element region defined by a field oxide film 2 which is disposed on the semiconductor substrate 1. Sequentially formed over the field effect transistor are an insulating film 7, a silicon nitride film 8 made of an etch barrier material and a polysilicon film 9 for a mask having a predetermined dimension. Spacers 10 are formed on side walls of the polysilicon film 9 for mask, respectively.

The field effect transistor has a lightly doped drain structure including a diffusion region 6 for drain or source, another diffusion region 6' for source or drain, a gate oxide film 3 disposed at a channel region defined between the diffusion regions 6 and 6', and a word line 4 disposed over the gate oxide film 3 and serving as a gate electrode. A spacer oxide film 5 is formed on each of side walls of the word line 4. Each of the diffusion regions 6 and 6' has a low concentration impurity region (not shown) and a high concentration impurity region (not shown).

The semiconductor memory device further includes a first charge storage electrode pattern 21A formed over the polysilicon film 9 for mask and the spacers 10 and electrically connected with the diffusion region 6, and a second charge storage electrode pattern 23A formed above the first charge storage electrode pattern 21A and spaced a predetermined vertical distance apart from the first charge storage electrode pattern 21A. The first and second charge storage electrode patterns 21A and 23A are electrically connected with each other via a third charge storage electrode pattern 24A formed on the silicon nitride film 8. The third charge storage electrode pattern 24A is in contact with side walls of the polysilicon film 9 for mask, the first charge storage electrode pattern 21A and the second charge storage electrode pattern 23A. Over exposed upper surfaces of the first, second and third charge storage electrode patterns 21A, 23A and 24A, a dielectric film 18 and a plate electrode 19 are sequentially formed.

FIGS. 5A to 5E are sectional views respectively illustrating a method for fabricating the memory cell of the semiconductor memory device having the above-mentioned structure in accordance with the another embodiment of the present invention. In FIGS. 5A to 5E, elements repectively corresponding to those in FIG. 4 are denoted by the same reference numerals.

Figure 5A:
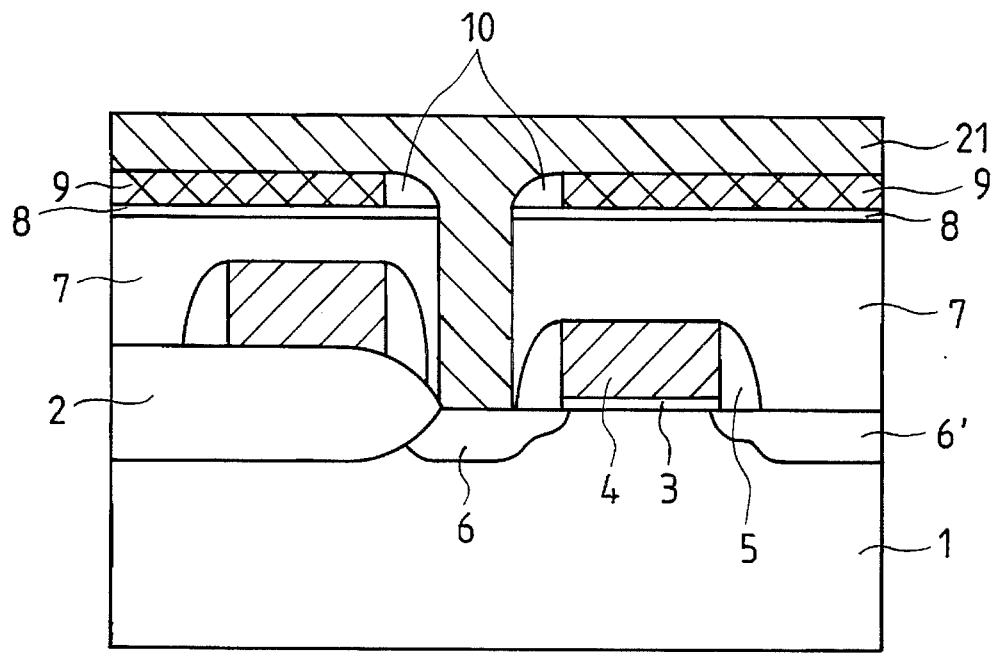
FIGS. 5A to 5E are sectional views respectively illustrating a method for fabricating the memory cell of the semiconductor memory device of FIG. 4.

In accordance with this method, a semiconductor substrate 1 formed with a P-well or N-well is prepared, as shown in FIG. 5A. On the upper surface of the semiconductor substrate 1, a field oxide film 2 is grown using the LOCOS process. By the field oxide film 2, element regions are defined on the upper surface of the semiconductor substrate 1. At each element region of the semiconductor substrate 1, a gate oxide film 3 and a word line pattern 4 are sequentially deposited. Thereafter, N type (or P type) impurity ions are implanted in a low concentration into a portion of each element region exposed between adjacent word line patterns 4, thereby forming a low concentration diffusion region at the upper surface of semiconductor substrate 1. A spacer oxide film 5 is then formed on each side wall of each word line pattern 4. Subsequently, N type (or P type) impurity ions are implanted in a high concentration into a portion of semiconductor substrate 1 exposed between adjacent spacer oxide films 5, thereby forming a high concentration diffusion region beneath each low concentration diffusion region. These low and high concentration diffusion regions constitute diffusion regions 6 and 6' of each LDD structure, respectively. Together with these diffusion regions 6 and 6', each corresponding word line pattern 4 constitutes a field effect transistor. The fabrication of such a field effect transistor is achieved in the same manner as in the conventional memory cell fabrication method of FIG. 1.

An insulating oxide film 7 is then deposited over the portion of semiconductor substrate 1 on which the field effect transistor is formed, so as to obtain an interlayer insulation. The insulating oxide film 7 has a planarized surface formed by the full-surface etch process. Over the planarized surface of insulating oxide film 7, a silicon nitride film 8 and a polysilicon film 9 are sequentially formed to have predetermined thicknesses, respectively. The silicon nitride film 8 serves as an etch barrier whereas the polysilicon film 9 is used as a mask at a subsequent step. A polysilicon spacer 10 is then partially formed on each of side walls of the polysilicon film 9. Each of the polysilicon spacer 10 is formed by anisotropically etching a predetermined portion of the polysilicon film 9.

Over the entire exposed surface of the resulting structure including the polysilicon film 9 and the polysilicon spacer 10, a first charge storage electrode layer 21 is formed such that it is electrically connected with the diffusion region 6 for source (or drain). The formation of the first charge storage electrode layer 21 is achieved by removing a portion of the silicon nitride film 8 exposed between adjacent polysilicon spacers 10 and a portion of the insulating oxide film 7 disposed beneath the exposed portion of silicon nitride film 8 to form a contact hole through which the diffusion region 6 for source (or drain) is exposed, depositing a polysilicon film over the entire exposed surface of the resulting structure including the contact hole to a predetermined thickness, and implanting impurity ions into the polysilicon film.

Figure 5B:
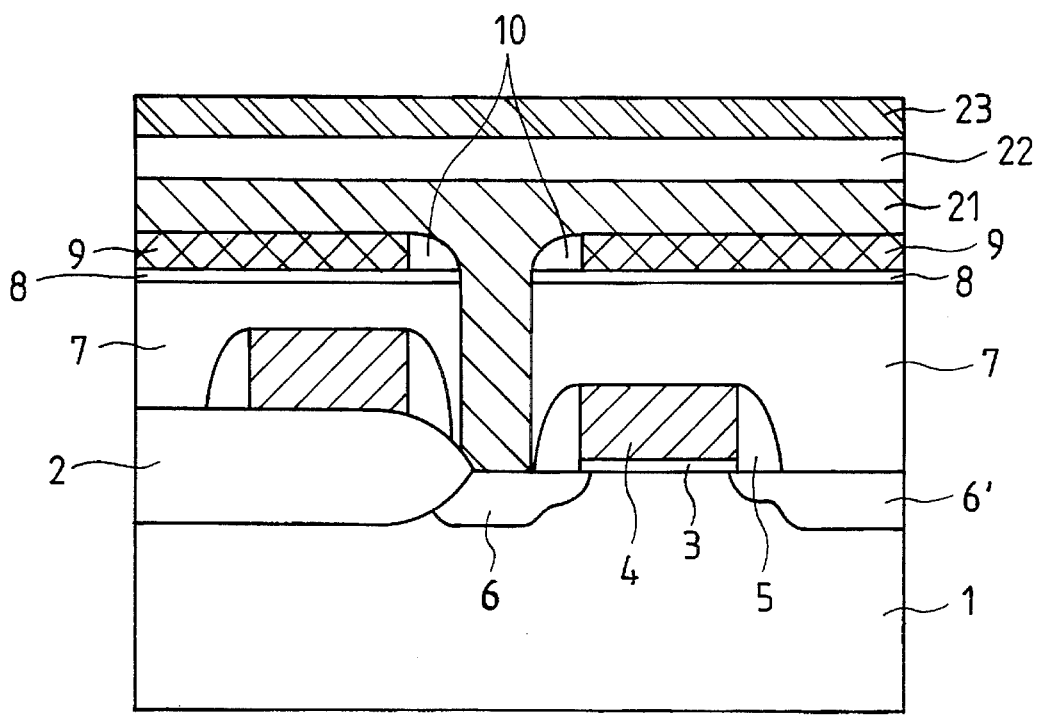

Over the first charge storage electrode layer 21, a first sacrificial oxide film 22 and a second charge storage electrode layer 23 are sequentially formed using the deposition process, as shown in FIG. 5B. The second charge storage electrode layer 23 is comprised of a doped polysilicon film.

Figure 5C:
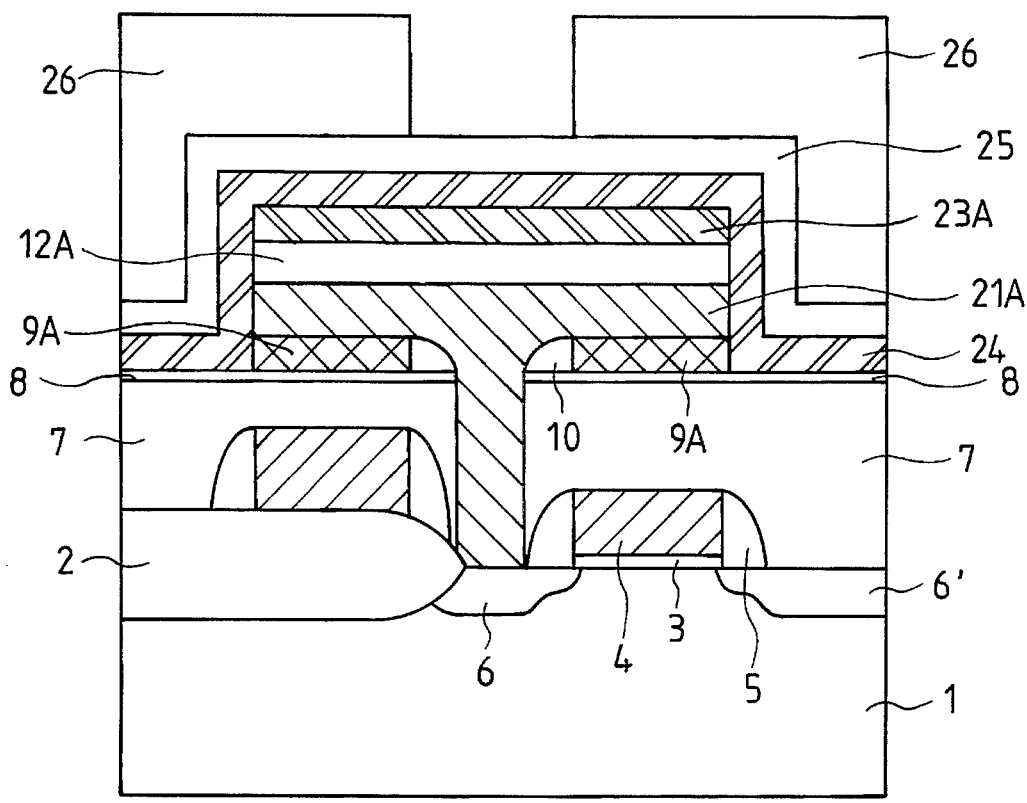

Thereafter, the second charge storage electrode layer 23, the first sacrificial oxide film 22, the first charge storage electrode layer 21 and the polysilicon film 9 are selectively etched using a mask for charge storage electrode, thereby forming a second charge storage electrode pattern 23A, a first sacrificial oxide film pattern 22A, a first charge storage electrode pattern 21A and a polysilicon pattern 9A, as shown in FIG. 5C. Over the entire exposed surface of the resulting structure, a third charge storage electrode layer 24 and a second sacrificial oxide film 25 are sequentially formed by use of the deposition process. The third charge storage electrode layer 24 is comprised of a doped polysilicon film. On the second sacrificial oxide film 25, a photoresist pattern 26 for contact hole is then formed.

Figure 5D:
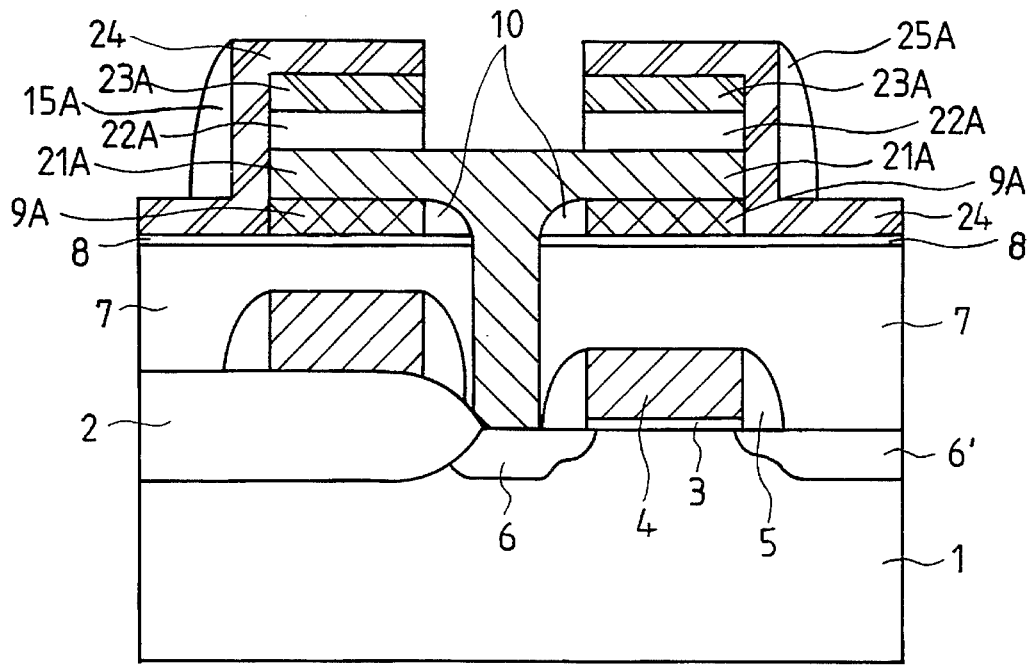
Figure 5E:
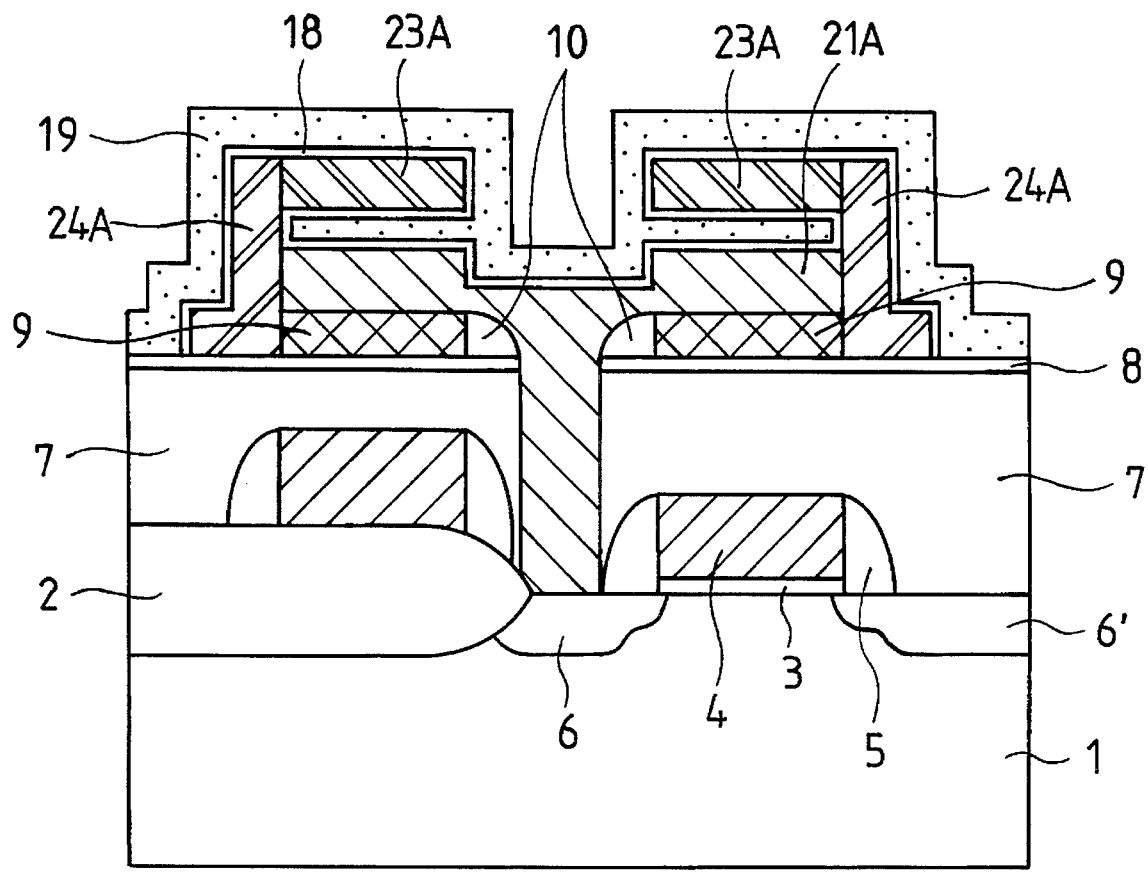

A portion of the second sacrificial oxide film 25 exposed after the formation of photoresist pattern 26, and respective portions of the third charge storage electrode layer 24 and second charge storage electrode pattern 23A disposed beneath the exposed portion of the second sacrificial oxide film 25 are etched sequentially and selectively, as shown in FIG. 5D. After completion of the selective etch of the second charge storage electrode pattern 23A, the photoresist pattern 26 is removed. Subsequently, the second sacrificial oxide film 25 and the first sacrificial oxide film pattern 22A are full-surface etched. At the step of etching the sacrificial oxide films, the first sacrificial oxide film pattern 22A is partially removed, thereby partially exposing the first charge storage electrode pattern 21A. By the full-surface etch of the second sacrificial oxide film 25, a sacrificial oxide film spacer 15A is formed on each of side wall portions of the third charge storage electrode layer 24.

Exposed portions of the third charge storage electrode layer 24 is full-surface etched until the silicon nitride film 8 disposed beneath the third charge storage electrode layer 24 is exposed. sA a result, a third charge storage electrode pattern 24A is formed which is in contact with side walls of the polysilicon pattern 9A, the first charge storage electrode pattern 21A, the first sacrificial oxide film pattern 22A and the second charge storage electrode pattern 23A. At the step of etching the third charge storage electrode layer 24, the exposed portion of the first charge storage electrode pattern 21A is also isotropically etched, thereby forming a recess at the surface of the first charge storage electrode pattern 21A. The first charge storage electrode pattern has a larger thickness than that of the third charge storage electrode layer 24, so as to prevent the polysilicon spacers 10 from being exposed upon isotropically etching the first charge storage electrode pattern 21A to form the recess, as mentioned above.

After completion of the etch of the first charge storage electrode pattern 21A and the third charge storage electrode layer 24, the sacrificial oxide film spacers 25A and the first sacrificial oxide film pattern 22A are completely removed using a wet etch process, thereby exposing the outer side wall surfaces of the third charge storage electrode pattern 24A, the upper surface of the first charge storage electrode pattern 21A and the lower surface of the second charge storage electrode pattern 23A. Also, the middle portion of the inner side wall surfaces of the third charge storage electrode pattern 24A is exposed. Thereafter, the entire exposed surface of the resulting structure including the exposed surfaces of the first, second and third charge storage electrode patterns 21A, 23A and 24A, a dielectric film 18 and a plate electrode 19 are sequentially formed. The formation of dielectric film 18 is achieved by growing a dielectric material having a composite structure of NO or ONO over the exposed surfaces of the first, second and third charge storage electrode patterns 21A, 23A and 24A. On the other hand, the formation of plate electrode 19 is achieved by depositing a doped polysilicon film to a predetermined thickness and then patterning the doped polysilicon film. The polysilicon film 9 for mask and the polysilicon spacers 10 are doped with impurity ions diffused from the first and third charge storage electrode patterns 21A and 24A at the step of forming the dielectric film 18 and a subsequent annealing step. Accordingly, the doped polysilicon film 9 and the doped polysilicon spacers 10 can serve as a charge storage electrode, together with the first, second and third charge storage electrode patterns 21A, 23A and 24A.

As apparent from the above description, the present invention provides a semiconductor memory device including memory cells each having a storage electrode of a cylindrical or double cylindrical shape capable of having a surface area greatly larger than the occupied area of the memory cell. By virtue of this feature, the semiconductor memory device can have a sufficient charge storage capacity at a high integration degree. Accordingly, the semiconductor memory device exhibits an improvement in reliability at a high integration degree.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a dynamic random access memory cell, comprising the steps of:

forming a planarizing insulating film over a semiconductor substrate including a metal oxide transistor, sequentially depositing an etch barrier layer and a polysilicon layer over the planarizing insulating film, and etching a portion of the polysilicon layer corresponding to a contact region by use of a storage electrode contact mask, thereby forming polysilicon spacers respectively on side walls of the polysilicon layer;

etching a portion of the etch barrier layer corresponding to the contact region and a portion of the planarizing insulating film disposed beneath the portion of the etch barrier layer by using the polysilicon layer and the polysilicon spacers as a mask, thereby forming a contact hole through which the semiconductor is partially exposed; then sequentially forming a polysilicon layer for a first storage electrode and a first oxide film, then forming a photoresist pattern at a storage electrode contact region, and a second oxide film over an exposed portion of the first oxide film;

removing the photoresist pattern, then forming another photoresist pattern for a storage electrode mask, and removing respective exposed portions of the second oxide film, the first oxide film, the polysilicon layer for the first storage electrode and the polysilicon layer, thereby primarily forming a storage electrode pattern;

removing the photoresist pattern for the storage electrode, forming a polysilicon layer for a second storage electrode, and forming spacers of a third oxide film respectively on side walls of the polysilicon layer for the second storage electrode;

etching the polysilicon layer for the second storage electrode until both the second oxide film and the etch barrier layer are exposed, thereby forming a storage electrode pattern having a double cylindrical structure; and removing respective remaining portions of the third oxide film spacers, the second oxide film and the first oxide film, forming a dielectric film for a capacitor over the storage electrode pattern, and forming a plate electrode over the dielectric film.

2. A method in accordance with claim 1, wherein the formation of the storage electrode pattern having the double cylindrical structure is achieved by etching the polysilicon layer for the second storage electrode without forming the third oxide film spacer.

3. A method in accordance with claim 1, wherein the etch barrier layer disposed beneath the storage electrode pattern is removed after removal of the third oxide film spacer, the second oxide film and the first oxide film.

4. A method for fabricating a semiconductor memory device, comprising the steps of:

growing a field oxide film on a semiconductor substrate, forming a field effect transistor on the semiconductor substrate, and forming a planarized insulating oxide film for an interlayer insulation on the semiconductor substrate;

exposing an active region of the field effect transistor, then depositing a doped polysilicon layer, and forming a first charge storage electrode electrically connected with the active region;

depositing a first sacrificial oxide film over the first charge storage electrode, and depositing a doped polysilicon film over the first sacrificial oxide film, thereby forming a second charge storage electrode;

patterning the second charge storage electrode, the first sacrificial oxide film, the first charge storage electrode and the polysilicon film by using a mask for a charge storage electrode;

sequentially depositing a third charge storage electrode made of a doped polysilicon and a second sacrificial oxide film respectively their developing a photoresist pattern by using a mask for a charge storage electrode contact, which is corresponding to said active region then sequentially and selectively etching the second sacrificial oxide film and the third charge storage electrode and first sacrificial oxide to expose first charge electrode, then removing the photoresist pattern;

removing said second sacrificial oxide film to expose said third charge storage electrode and forming oxide film spacers respectively on side walls of the third charge storage electrode;

etching said exposed portions of the first charge storage electrode and the third charge storage electrode, thereby forming a third charge storage electrode pattern extending between each side surface of the first charge storage electrode and each corresponding side surface of the second charge storage electrode;

removing the oxide film spacers and the first sacrificial oxide film by using a silicon nitride film as another stop; and sequentially forming a dielectric film and a plate electrode over an entire exposed surface of the resulting structure including the first, second and third charge storage electrode pattern.

5. A method in accordance with claim 4, wherein the step of forming the field effect transistor comprises the steps of forming a gate oxide film and a word line pattern for a gate electrode on the semiconductor substrate, implanting impurity ions into the semiconductor substrate in a first concentration, forming second oxide film spacers respectively on side walls of the word line pattern, then implanting impurity ions with a concentration higher than said first concentration into the semiconductor substrate.

6. A method in accordance with claim 4, wherein the step of exposing the active region further comprises the steps of sequentially depositing a silicon nitride film for an etch barrier and a polysilicon film for a mask over the planarized insulating film respectively, anisotropically etching a portion of the polysilicon film for the mask, thereby forming polysilicon film spacers respectively on side walls of the polysilicon film for the mask, and sequentially etching the silicon nitride film and the planarized insulating film.

* * * * *